(12) United States Patent
Lee

(10) Patent No.: US 9,123,398 B2
(45) Date of Patent: Sep. 1, 2015

(54) SEMICONDUCTOR MEMORY CIRCUIT AND DATA PROCESSING USING THE SAME

(75) Inventor: Dong Uk Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 314 days.

(21) Appl. No.: 13/602,129

(22) Filed: Sep. 1, 2012

(65) Prior Publication Data

US 2013/0265835 A1   Oct. 10, 2013

(30) Foreign Application Priority Data

Apr. 4, 2012  (KR) .................... 10-2012-0035019

(51) Int. Cl.
*G11C 7/00* (2006.01)
*G11C 7/10* (2006.01)

(52) U.S. Cl.
CPC .............. *G11C 7/1066* (2013.01); *G11C 7/109* (2013.01); *G11C 7/1093* (2013.01)

(58) Field of Classification Search
CPC ..... G11C 7/1066; G11C 7/1093; G11C 7/109

USPC ............. 365/193, 194, 233.1, 233.11, 233.12
See application file for complete search history.

(56) References Cited

U.S. PATENT DOCUMENTS

| 6,456,544 B1* | 9/2002 | Zumkehr | 365/193 |
| 2010/0124131 A1* | 5/2010 | Onishi | 365/193 |

FOREIGN PATENT DOCUMENTS

| KR | 1020090093305 A | 9/2009 |
| KR | 1020120063137 A | 6/2012 |

* cited by examiner

*Primary Examiner* — Tha-O H Bui
(74) *Attorney, Agent, or Firm* — William Park & Associates Ltd.

(57) ABSTRACT

The present invention relates to a semiconductor memory circuit enabling stable data transmission in a high frequency operation and a data processing system using the same. The data processing system includes a semiconductor memory circuit configured to output data, corresponding to a read command, in response to an external strobe signal, and a controller configured to provide the semiconductor memory circuit with the read command and the strobe signal related to the read command.

7 Claims, 9 Drawing Sheets

*Preamble=2,Postamble=2
PR1=H ,PR2=H ,PO1=H ,PO2=H

*Preamble=1,Postamble=1
PR1=H ,PR2=L ,PO1=H ,PO2=L

SEMICONDUCTOR MEMORY CIRCUIT AND DATA PROCESSING USING THE SAME

CROSS-REFERENCES TO RELATED APPLICATION

The present application claims priority under 35 U.S.C. §119(a) to Korean application number 10-2012-0035019, filed on Apr. 4, 2012, in the Korean Intellectual Property Office, which is incorporated herein by reference in its entirety.

BACKGROUND

1. Technical Field

The present invention relates to a semiconductor circuit, and more particularly, to a semiconductor memory circuit and a data processing system using the same.

2. Related Art

A data processing system may include semiconductor integrated circuits, such as a semiconductor memory circuit and a controller, e.g. a CPU or a GPU.

When a read command is received from the controller, the semiconductor memory circuit outputs data stored therein to the controller with the assistance of an internal clock signal.

When a write command is received, the semiconductor memory circuit writes data, provided from the controller, into an internal memory block in response to a strobe signal provided by the controller.

Electronic devices, such as mobile phones and computers, require high speed operation, and thus, higher operating frequencies.

Accordingly, it is necessary for a semiconductor memory circuit to sufficiently secure a timing margin in a data transfer process and to maintain stable performance even during a high speed operation.

SUMMARY

A semiconductor memory circuit enabling stable data transmission in a high frequency operation and a data processing system using the same are described herein.

In an embodiment of the present invention, a data processing system includes a semiconductor memory circuit configured to output data, corresponding to a read command, in response to an external strobe signal, and a controller configured to provide the semiconductor memory circuit with the read command and the strobe signal related to the read command.

In an embodiment of the present invention, a semiconductor memory circuit includes a command decoder configured to generate a read command by decoding a command signal, a data path activation unit configured to generate a selection signal in response to an address signal and the read command, a memory block configured to provide a signal line with data corresponding to the selection signal, an output latch unit configured to output the data of the signal line in response to data output enable signals, and an output timing adjustment unit configured to both adjust the timing of the read command received based on a clock signal and to generate the data output enable signals used for a strobe signal based on the adjusted timing.

BRIEF DESCRIPTION OF THE DRAWINGS

Features, aspects, and embodiments are described in conjunction with the attached drawings, in which.

DETAILED DESCRIPTION

Hereinafter, a semiconductor memory circuit and a data processing system using the same according to the present invention will be described below with reference to the accompanying drawings through various embodiments.

Figure 1:
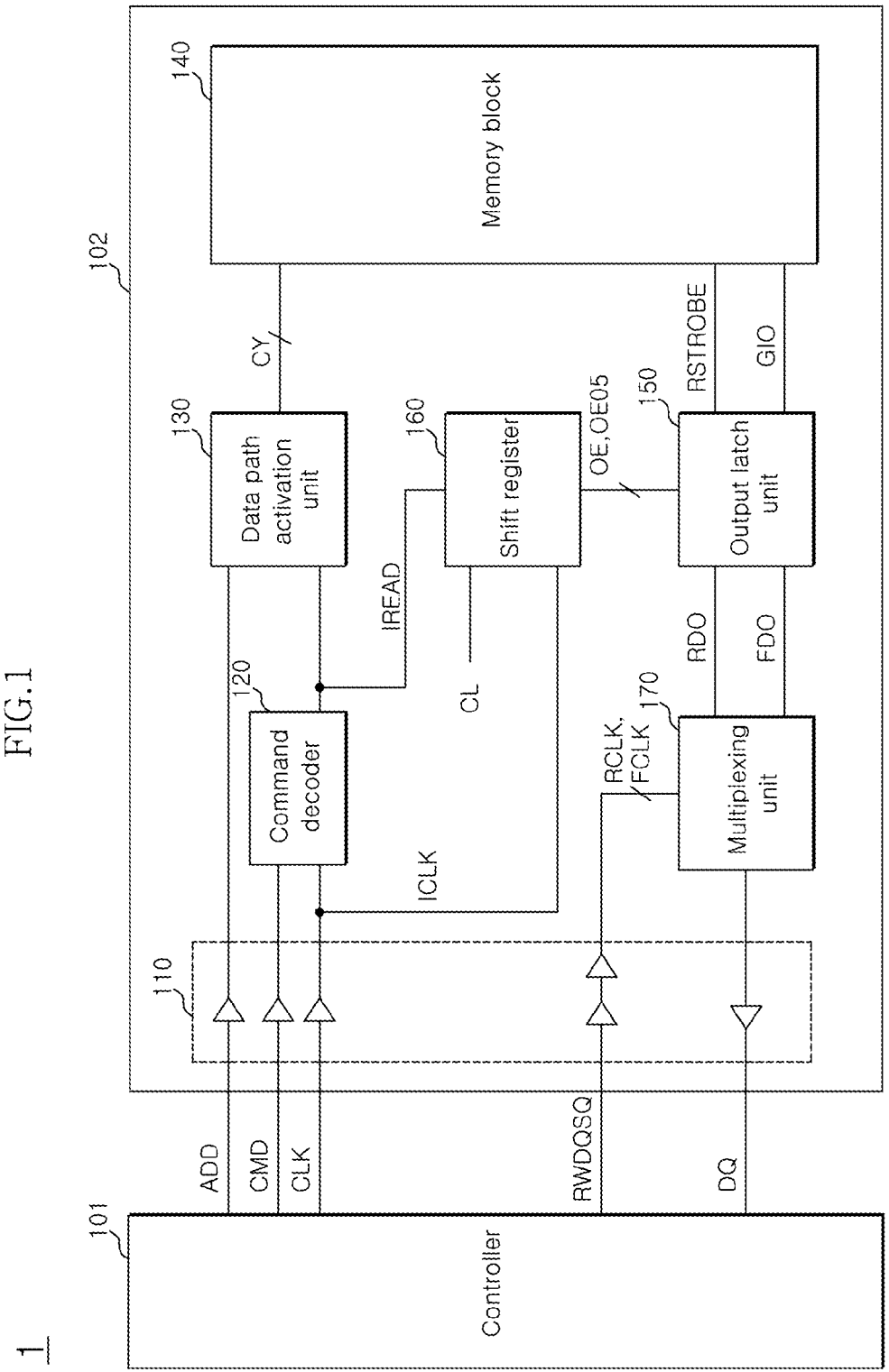
FIG. 1 is a block diagram showing the construction of a data processing system 1 according to an embodiment of the present invention.

FIG. 1 is a block diagram showing the construction of a data processing system 1 according to an embodiment of the present invention.

As shown in FIG. 1, the data processing system 1 according to the embodiment of the present invention may include a controller 101 and a semiconductor memory circuit 102.

The controller 101 may provide an address signal ADD, a command signal CMD, a clock signal CLK, and a strobe signal RWDQSQ to the semiconductor memory circuit 102.

The controller 101 may provide the strobe signal RWDQSQ to the semiconductor memory circuit 102 when a read or write command is received.

The controller 101 may include a CPU or a GPU.

The semiconductor memory circuit 102 may perform a read operation in response to the strobe signal RWDQSQ provided from the outside, such as from the controller 101.

If the command signal CMD defines a read command, the semiconductor memory circuit 102 may output data, corresponding to the address signal ADD, to the outside, such as to the controller 101, in response to the strobe signal RWDQSQ.

The semiconductor memory circuit 102 may include a plurality of buffers 110, a command decoder 120, a data path activation unit 130, a memory block 140, an output latch unit 150, a shift register 160, and a multiplexing unit 170.

The plurality of buffers 110 may receive the address signal ADD, the command signal CMD, the clock signal CLK, and the strobe signal RWDQSQ, and transmit data that is output from the multiplexing unit 170 to the controller 101 via a pad DQ.

The clock signal CLK may output as an internal clock signal ICLK via one of the plurality of buffers 110.

The strobe signal RWDQSQ may output as phase separation strobe signals RCLK and FCLK via one of the plurality of buffers 110.

The command decoder 120 may generate an internal read command IREAD by decoding the command signal CMD.

The data path activation unit 130 may generate a selection signal CY to activate the data transfer path of the memory block 140, in response to the internal read command IREAD and the address signal ADD.

The memory block 140 may output data, corresponding to the selection signal CY, through a global data line GIO.

The memory block 140 may output an information signal RSTROBE to inform that data has been sent through the global data line GIO.

The shift register 160 may generate data output enable signals OE and OE05 in response to the internal read command IREAD, a CAS latency signal CL, and the internal clock signal ICLK.

The output latch unit 150 may latch the data loaded on the global data line GIO to generate output data (hereinafter referred to as 'read data RDO and FDO,' according to a read command, in response to data output enable signals OE and OE05.

The multiplexing unit 170 may output the read data RDO and FDO selectively in response to the phase separation strobe signals RCLK and FCLK.

Figure 2:
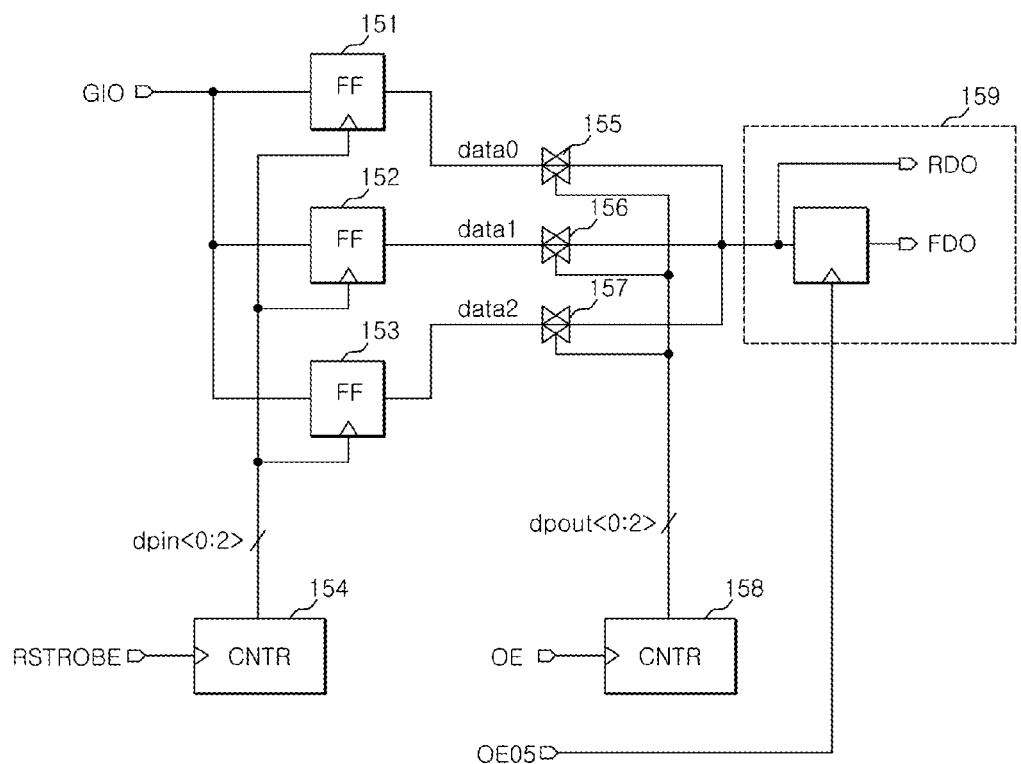
FIG. 2 is a circuit diagram showing the construction of an output latch unit 150 of FIG. 1.

FIG. 2 is a circuit diagram showing the construction of the output latch unit 150 of FIG. 1.

As shown in FIG. 2, the output latch unit 150 may be formed as a first-in first-out (FIFO) register.

The output latch unit 150 may include a plurality of flip-flops FF 151~153, a plurality of ring counters CNTR 154 and 158, a plurality of switches 155~157, and a demultiplexing unit 159.

The ring counter 154 may generate count signals dpin<0:2> in response to the information signal RSTROBE provided from the memory block 140.

The plurality of flip-flops 151~153 may sequentially latch data outputted through the global data line GIO in response to the count signals dpin<0:2>.

The ring counter 158 may generate count signals dpout<0:2> in response to the data output enable signal OE.

The plurality of switches 155~157 may output the data, latched in the plurality of flip-flops 151~153, sequentially in response to the count signals dpout<0:2>.

The demultiplexing unit 159 may output the output of the plurality of switches 155~157 as the read data RDO and FDO in response to the data output enable signal OE05.

Figure 3:
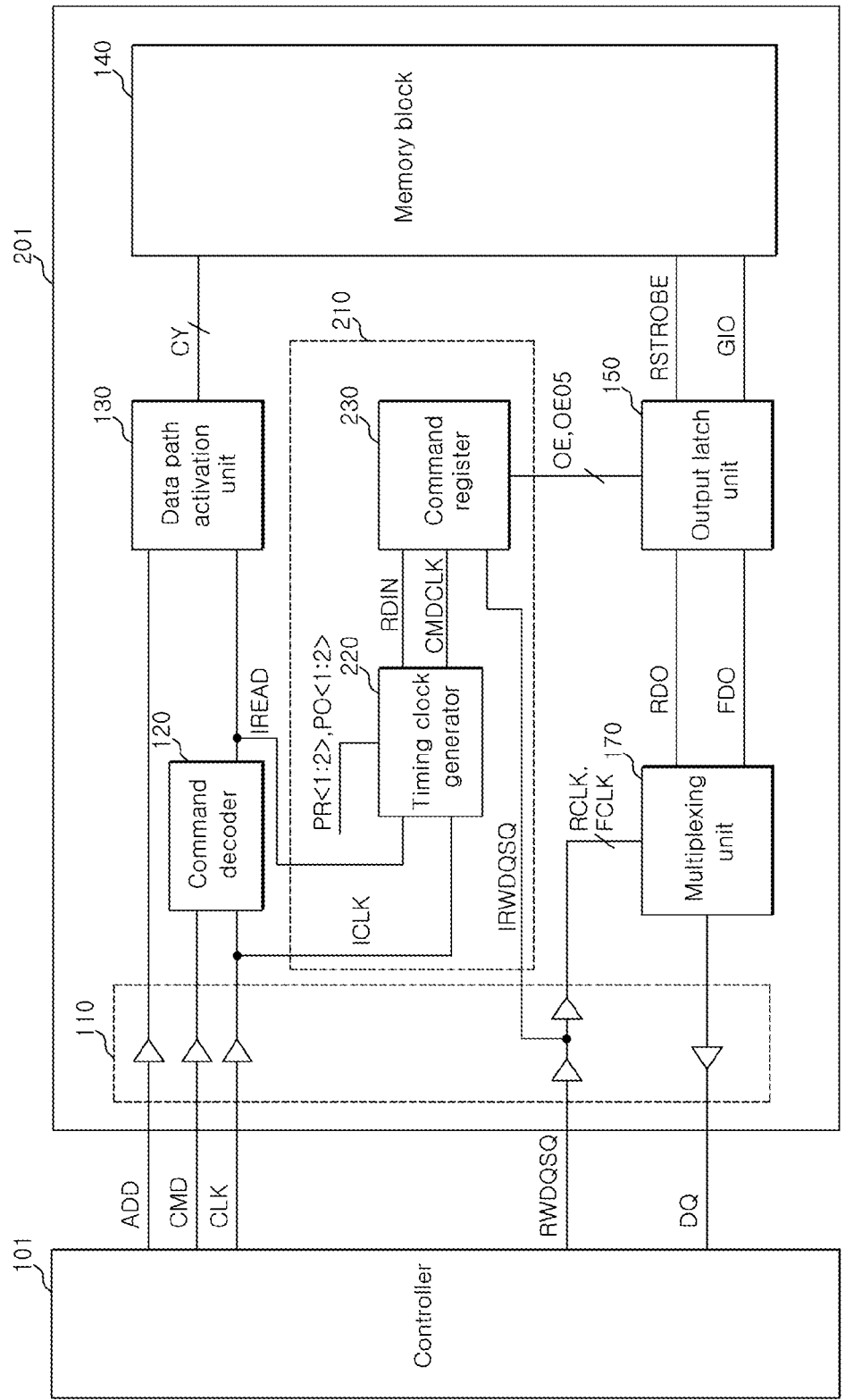
FIG. 3 is a block diagram showing the construction of a data processing system 2 according to an embodiment of the present invention.

FIG. 3 is a block diagram showing the construction of a data processing system 2 according to an embodiment of the present invention.

As shown in FIG. 3, the data processing system 2 according to an embodiment of the present invention may include a controller 101 and a semiconductor memory circuit 201.

The controller 101 may provide an address signal ADD, a command signal CMD, a clock signal CLK, and a strobe signal RWDQSQ to the semiconductor memory circuit 201.

The controller 101 may provide the strobe signal RWDQSQ to the semiconductor memory circuit 201 when a read or write command is received.

When a read operation is performed, the strobe signal RWDQSQ may be used as a signal when the semiconductor memory circuit 201 outputs data.

When a write operation is performed, the strobe signal RWDQSQ may be used as a signal when the semiconductor memory circuit 201 reads in data provided from the controller 101.

The controller 101 may include a CPU or a GPU.

The semiconductor memory circuit 201 may perform a read operation in response to the strobe signal RWDQSQ provided from the outside, such as from the controller 101.

The semiconductor memory circuit 201 may adjust the output timing of data, corresponding to the address signal ADD, on the basis of the strobe signal RWDQSQ when a read operation is performed.

The semiconductor memory circuit 201 may include a plurality of buffers 110, a command decoder 120, a data path activation unit 130, a memory block 140, an output latch unit 150, a multiplexing unit 170, and an output timing adjustment unit 210.

The plurality of buffers 110 may receive the address signal ADD, the command signal CMD, the clock signal CLK, and the strobe signal RWDQSQ, and transmit data that is output from the multiplexing unit 170 to the controller 101 via a pad DQ.

The clock signal CLK may output as the internal clock signal ICLK via any one of the plurality of buffers 110.

The strobe signal RWDQSQ may output as a strobe signal IRWDQSQ to which the same delay time as the internal clock signal ICLK has been applied via any one of the plurality of buffers 110.

The strobe signal IRWDQSQ may output as phase separation strobe signals RCLK and FCLK via one of the plurality of buffers 110.

The command decoder 120 may generate an internal read command IREAD by decoding the command signal CMD.

The data path activation unit 130 may generate a selection signal CY to activate the data transfer path of the memory block 140 in response to the internal read command IREAD and the address signal ADD.

The memory block 140 may output data, corresponding to the selection signal CY, through a global data line GIO.

The memory block 140 may generate an information signal RSTROBE to inform that data has been sent through the global data line GIO.

The output latch unit 150 may latch data loaded on the global data line GIO, in response to data output enable signals OE and OE05, to generate output data (hereinafter referred to as 'read data RDO and FDO') according to a read command.

The multiplexing unit 170 may output the read data RDO and FDO selectively in response to the phase separation strobe signals RCLK and FCLK.

The output timing adjustment unit 210 is a domain crossing block, and it may adjust the timing of a read command received on the basis of the internal clock signal ICLK to generate the data output enable signals OE and OE05, which are both used for the strobe signal RWDQSQ based on the adjusted timing.

The output timing adjustment unit 210 may generate the data output enable signals OE and OE05 in response to preamble signals PR<1:2>, postamble signals PO<1:2>, the internal read command IREAD, an internal clock signal ICLK, and the strobe signal IRWDQSQ.

The preamble signals PR<1:2> may define preamble information, such as information about the number of preamble pulses supported by a system. For example, if the number of preamble pulses supported by a system is 0~2, the number of preamble pulses may be defined by using the preamble signals PR<1:2>.

The postamble signals PO<1:2> may define postamble information by using a similar method as that used in the preamble signals PR<1:2>.

The output timing adjustment unit 210 may include a timing clock generator 220 and a command register 230.

The timing clock generator 220 may shift the internal read command IREAD based on the preamble signals PR<1:2> and the postamble signals PO<1:2> in response to the internal clock signal ICLK to generate a plurality of timing clocks RDIN and CMDCLK based on the shifted internal read command IREAD.

The number of pulses of the timing clock CMDCLK is equal to the number of preamble pulses+the number of postamble pulses+1 for one command. For example, if one read command is received and there are two preamble pulses and two postamble pulses, the number of pulses of the timing clock CMDCLK is 5.

If preamble pulses or postamble pulses overlap with each other because a previous read command or a subsequent read command is received, the number of pulses of the timing clock CMDCLK may be reduced by the overlap amount.

The command register 230 may latch the timing clock RDIN on the basis of the timing clock CMDCLK and output the latched timing clock RDIN as the data output enable signals OE and OE05 on the basis of the strobe signal IRWDQSQ.

Figure 4:
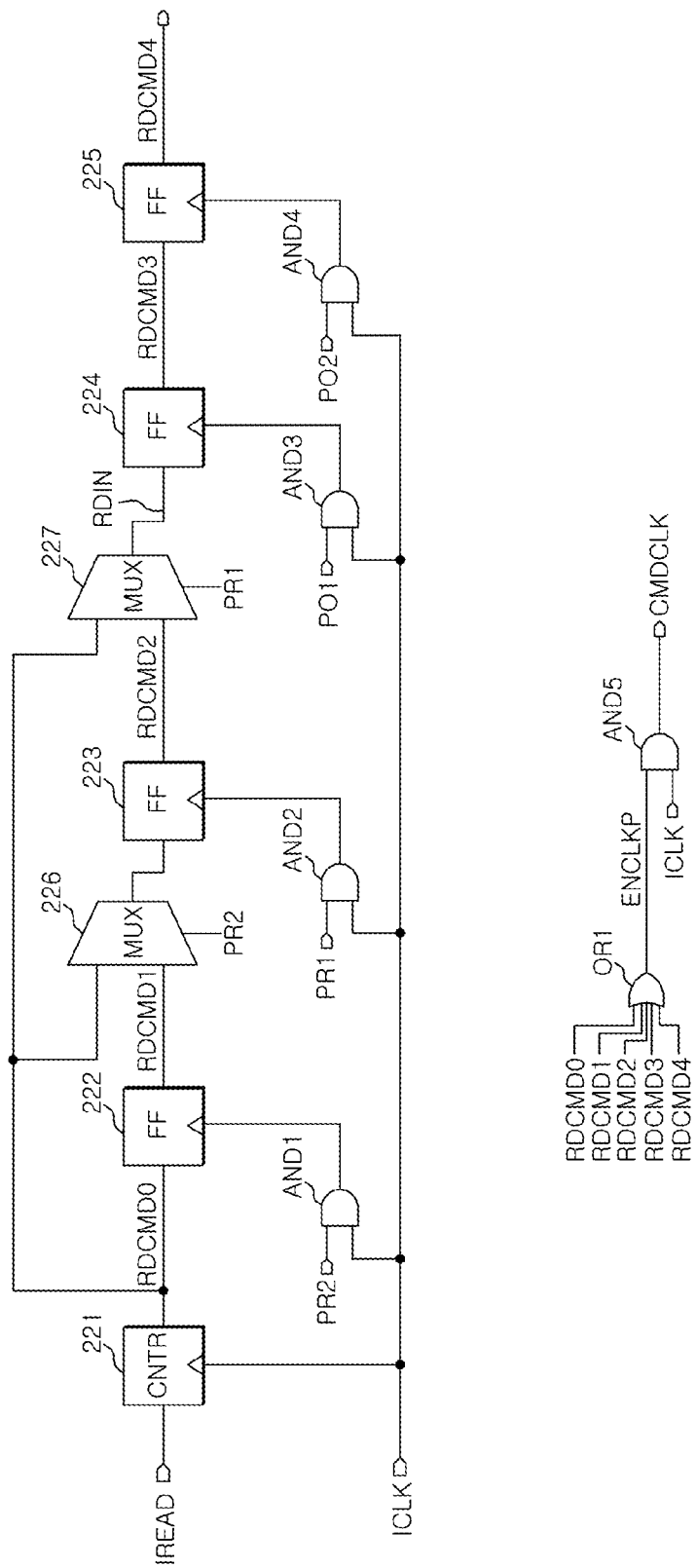
FIG. 4 is a circuit diagram showing the construction of a timing clock generator 220 of FIG. 3, FIGS. 5 and 6 are timing diagrams illustrating the operation of a timing clock generator 220 of FIG. 4.

FIG. 4 is a circuit diagram showing the construction of the timing clock generator 220 of FIG. 3.

As shown in FIG. 4, the timing clock generator 220 may include a ring counter CNTR 221, a plurality of flip-flops FF 222~225, a plurality of multiplexers MUX 226 and 227, and a plurality of logic gates OR1 and AND1~AND5.

The ring counter 221 may count the internal read command IREAD in response to the internal clock signal ICLK to generate a preliminary timing clock RDCMD0 based on the count.

The plurality of flip-flops 222·225 may shift the preliminary timing clock RDCMD0 in response to the output signals of the plurality of internal logic gates AND1~AND4 to generate a plurality of preliminary timing clocks RDCMD<1:4> based on the shifted preliminary timing clock RDCMD0.

The plurality of multiplexers 226 and 227 may output the plurality of preliminary timing clocks RDCMD<0:2> selectively in response to the respective preamble signals PR<1:2>.

The multiplexer 226 may output the preliminary timing clock RDCMD<0> or the preliminary timing clock RDCMD<1> in response to the preamble signal PR<2>.

Similarly, the multiplexer 227 may output the preliminary timing clock RDCMD<0> or the preliminary timing clock RDCMD<2> as the timing clock RDIN in response to the preamble signal PR<1>.

The plurality of logic gates AND1~AND4 may provide the internal clock signal ICLK to the plurality of flip-flops 222~225 in response to the postamble signals PO<1:2> and the preamble signals PR<1:2>.

The logic gates OR1 and AND5 may perform an OR operation on the plurality of preliminary timing clocks RDCMD<0:4>, and perform an AND operation on the result of the OR operation and the internal clock signal ICLK, respectively, to generate a result of the AND operation as the timing clock CMDCLK.

Figure 5:
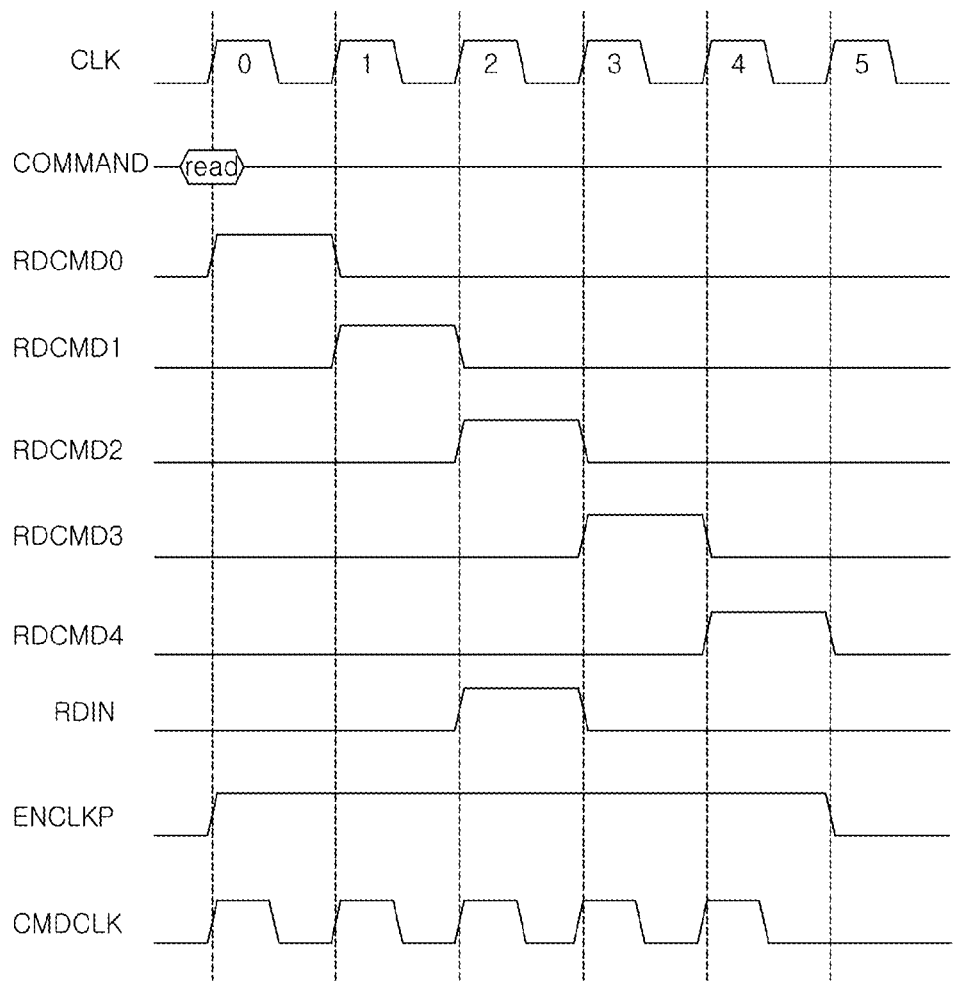
Figure 6:
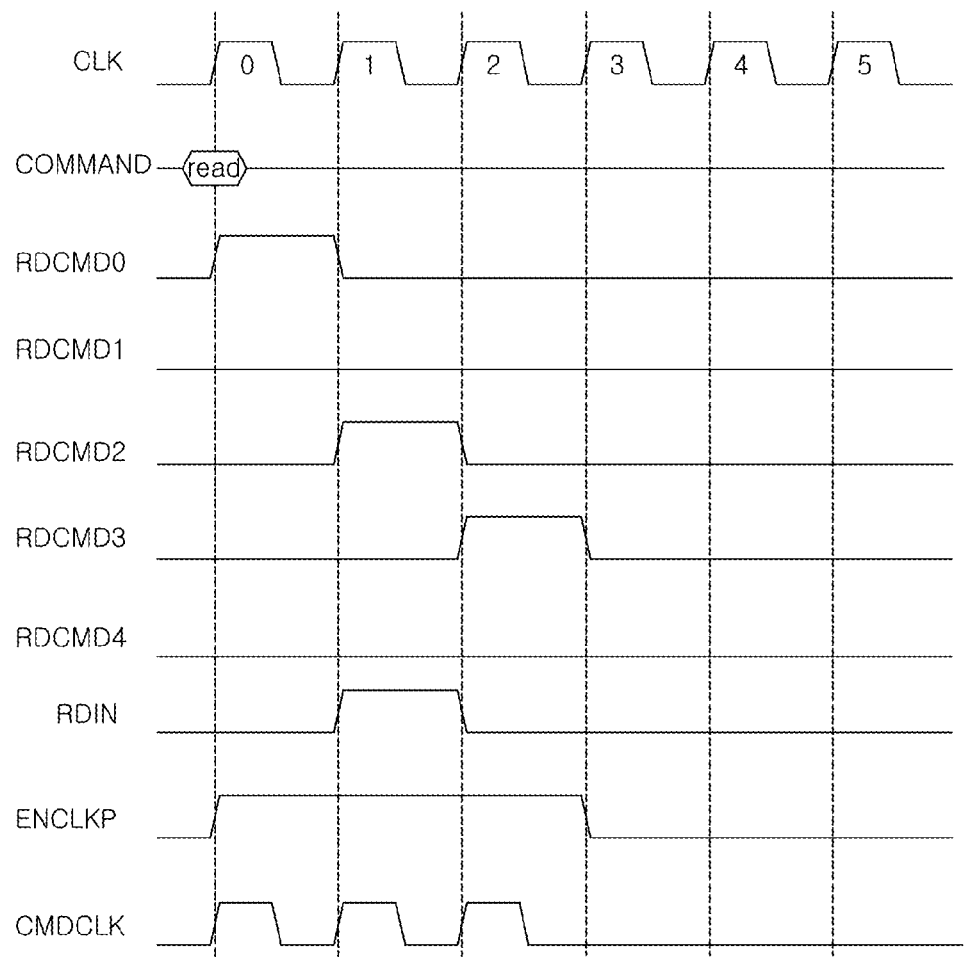

FIGS. 5 and 6 are timing diagrams illustrating the operation of the timing clock generator 220 of FIG. 4.

For example, assuming that each of the number of preamble pulses and the number of postamble pulses is 2, preamble signal PR1=H, the preamble signal PR2=H, the postamble signal PO1=H, and the postamble signal PO2=H.

Accordingly, as shown in FIG. 5, the timing clock generator 220 may activate the plurality of preliminary timing clocks RDCMD<1:4> in response to the preamble signals PR<1:2> and the postamble signals PO<1:2> having the above-described values to generate the timing clock CMDCLK having five pulses.

In another example, assuming that each of the number of preamble pulses and the number of postamble pulses is 1, the preamble signal PR1=H, the preamble signal PR2=L, the postamble signal PO1=H, and the postamble signal PO2=L.

Accordingly, as shown in FIG. 6, the timing clock generator 220 may activate the plurality of preliminary timing clocks RDCMD<0, 2, 3> in response to the preamble signals PR<1:2> and the postamble signals PO<1:2> having the above-described values to generate the timing clock CMDCLK having three pulses.

Figure 7:
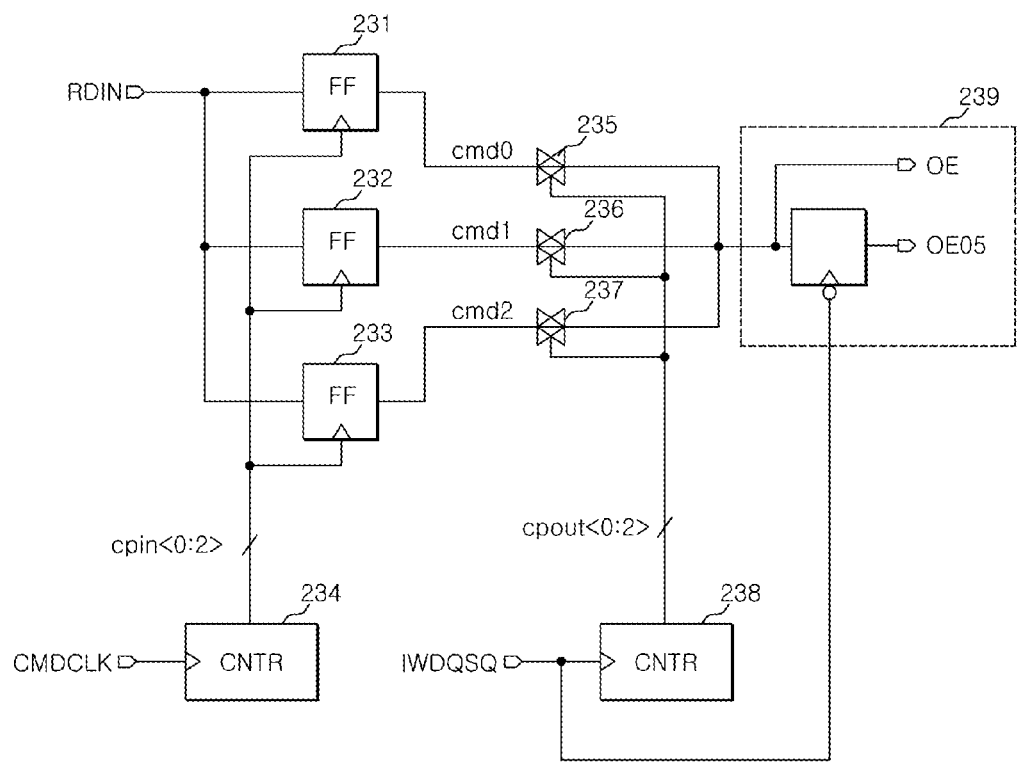
FIG. 7 is a circuit diagram showing the construction of a command register 230 of FIG. 3.

FIG. 7 is a circuit diagram showing the construction of the command register 230 of FIG. 3.

As shown in FIG. 7, the command register 230 may be formed as a first-in first-out (FIFO) register.

The command register 230 may include a plurality of flip-flops FF 231~233, a plurality of ring counters CNTR 234 and 238, a plurality of switches 235~237, and a demultiplexing unit 239.

The ring counter 234 may generate count signals cpin<0:2> in response to the timing clock CMDCLK.

The plurality of flip-flops 231~233 may sequentially latch the timing clock RDIN in response to the count signals cpin<0:2>.

The ring counter 238 may generate count signals cpout<0:2> in response to the strobe signal IRWDQSQ.

The plurality of switches 235~237 may sequentially output data, latched in the respective flip-flops 231~233, to the count signals cpout<0:2>.

The demultiplexing unit 239 may output the outputs of the plurality of switches 235~237 as the data output enable signals OE and OE05 in response to the strobe signal IRWDQSQ.

Figure 8:
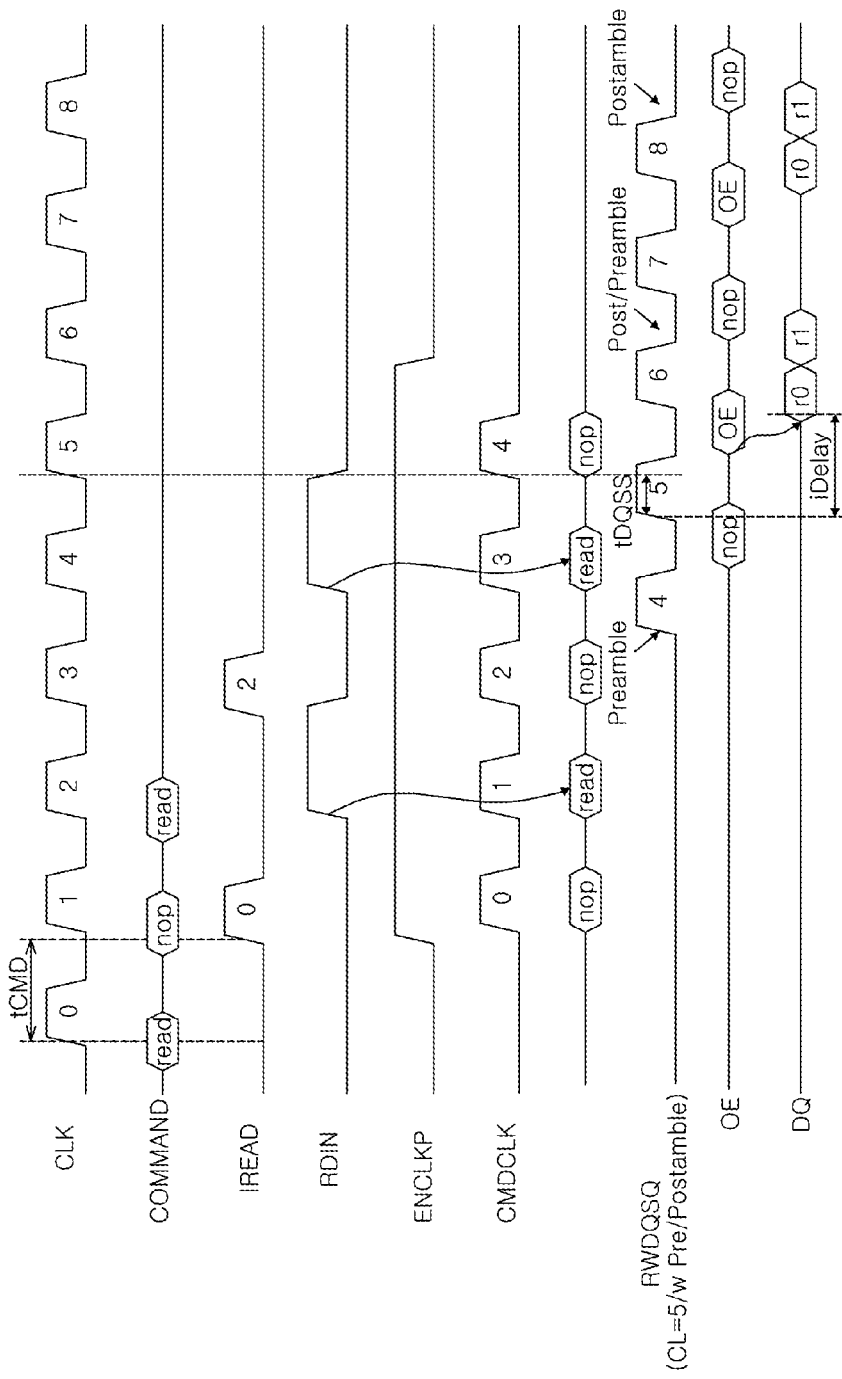
FIG. 8 is a timing diagram illustrating a read operation according to an embodiment of the present invention.

FIG. 8 is a timing diagram illustrating a read operation according to an embodiment of the present invention.

First, it is assumed that a read command, a no operation (NOP), and a read command are sequentially received, and each of the number of preamble pulses and the number of postamble pulses are 1.

The two internal read commands IREAD are generated at a predetermined delay time (tCMD) interval from the read command.

The timing clock CMDCLK is generated in response to the internal read command IREAD, and the timing clock RDIN is generated after 1tCK on the basis of each internal read command IREAD.

The data output enable signal OE is generated in response to the strobe signal RWDQSQ generated after CAS latency (CL).

Data is output via the pad DQ in response to the data output enable signal OE.

In accordance with the above-described method, the data output enable signal OE may be generated as the domain of the strobe signal RWDQSQ, and a timing error in the strobe signal RWDQSQ and the clock signal CLK due to tDQSS and power noise may be compensated for.

Figure 9:
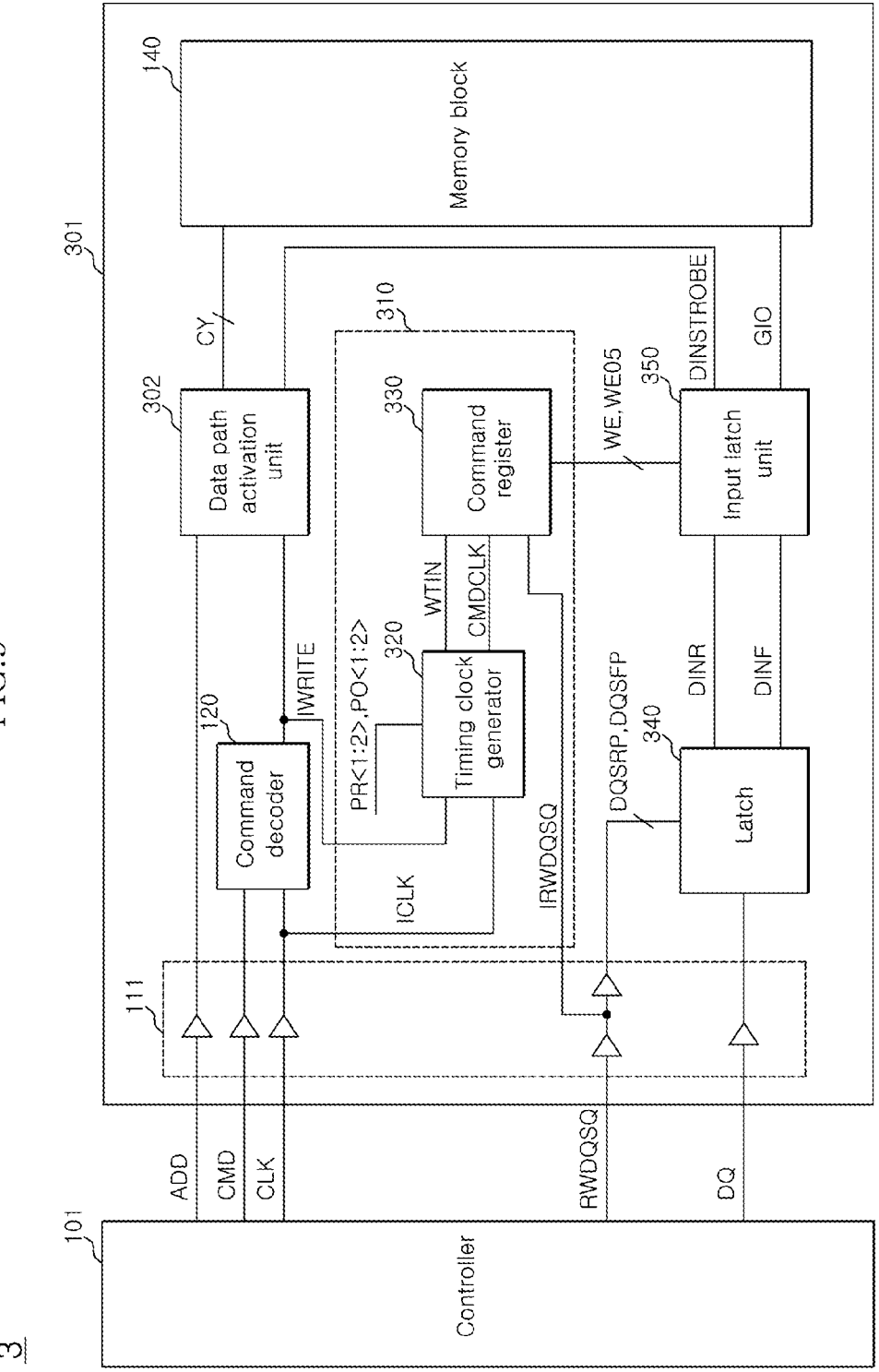
FIG. 9 is a block diagram showing the construction of a data processing system 3 according to an embodiment of the present invention.

FIG. 9 is a block diagram showing the construction of a data processing system 3 according to an embodiment of the present invention.

As shown in FIG. 9, the data processing system 3 according to an embodiment of the present invention may include a controller 101 and a semiconductor memory circuit 301.

The controller 101 may provide an address signal ADD, a command signal CMD, a clock signal CLK, and a strobe signal RWDQSQ to the semiconductor memory circuit 301.

The controller 101 may provide the strobe signal RWDQSQ to the semiconductor memory circuit 301 when a read or write command is received.

When a write operation is performed, the strobe signal RWDQSQ may be used as a signal when the semiconductor memory circuit 301 reads in data provided from the controller 101.

When a read operation is performed, the strobe signal RWDQSQ may be used as a signal when the semiconductor memory circuit 301 outputs data.

The controller 101 may include a CPU or a GPU.

The semiconductor memory circuit 301 may perform a write operation in response to the strobe signal RWDQSQ provided from the outside, such as the controller 101.

The semiconductor memory circuit 301 may adjust the write timing of data on the basis of the strobe signal RWDQSQ when a write operation is performed.

The semiconductor memory circuit 301 may include a plurality of buffers 111, a command decoder 120, a data path activation unit 302, a memory block 140, an input latch unit 350, a latch 340, and an input timing adjustment unit 310.

The plurality of buffers 111 may receive the address signal ADD, the command signal CMD, the clock signal CLK, and the strobe signal RWDQSQ, and can receive data via a pad DQ.

The clock signal CLK may output as an internal clock signal ICLK via any one of the plurality of buffers 111.

The strobe signal RWDQSQ may be output as a strobe signal IRWDQSQ to which the same delay time as the internal clock signal ICLK has been applied via any one of the plurality of buffers 111.

The strobe signal IRWDQSQ may be output as phase separation strobe signals DQSRP and DQSFP via any one of the plurality of buffers 111.

The command decoder 120 may generate an internal write command IWRITE by decoding the command signal CMD.

The data path activation unit 302 may generate a selection signal CY to activate the data transfer path of the memory block 140 in response to the internal write command IWRITE and the address signal ADD.

The data path activation unit 302 may output an information signal DINSTROBE that informs the input of data according to a write operation.

The memory block 140 may write data, received through a global data line GIO, into a region corresponding to the selection signal CY.

The latch 340 may latch data DINR and DINF, received through the pad DQ, in response to the phase separation strobe signals DQSRP and DQSFP.

The input latch unit 350 may latch the data DINR and DINF, latched in the latch 340, in response to the information signal DINSTROBE and data write enable signals WE and WE05 and input the latched data into the memory block 140 through the global data line GIO.

The input timing adjustment unit 310 is a domain crossing block, and it may adjust the timing of a write command received on the basis of the internal clock signal ICLK and to generate the data write enable signals WE and WE05 which are both used for the strobe signal RWDQSQ based on the adjusted timing.

The input timing adjustment unit 310 may generate the data write enable signals WE and WE05 in response to preamble signals PR<1:2>, postamble signals PO<1:2>, the internal write command signal IWRITE, the internal clock signal ICLK, and the strobe signal IRWDQSQ.

The preamble signals PR<1:2> may define preamble information, such as information about the number of preamble pulses supported by a system. For example, if the number of preamble pulses supported by a system is 0~2, the number of preamble pulses may be defined by using the preamble signals PR<1:2>.

The postamble signals PO<1:2> may define postamble information by using a similar method as that used in the preamble signals PR<1:2>.

The input timing adjustment unit 310 may include a timing clock generator 320 and a command register 330.

The timing clock generator 320 may shift the internal write command IWRITE based on the preamble signals PR<1:2> and the postamble signals PO<1:2> in response to the internal clock signal ICLK to generate a plurality of timing clocks WTIN and CMDCLK based on the shifted internal write command IWRITE.

The number of pulses of the timing clock CMDCLK is equal to the number of preamble pulses+the number of postamble pulses+1 for one command. For example, if one read command is received and there are two preamble pulses and two postamble pulses, the number of pulses of the timing clock CMDCLK is 5.

If preamble pulses or postamble pulses overlap with each other because a previous read command or a subsequent read command is received, the number of pulses of the timing clock CMDCLK may be reduced by the overlap amount.

The timing clock generator 320 may be configured like the timing clock generator 220 of FIG. 4.

The command register 330 may latch the timing clock WTIN on the basis of the timing clock CMDCLK and output the latched timing clock WTIN as the data write enable signals WE and WE05 on the basis of the strobe signal IRWDQSQ.

The command register 330 may be configured like the command register 230 of FIG. 7.

In accordance with the above-described method, the data write enable signal WE may be generated as the domain of the strobe signal RWDQSQ, and a timing error in the strobe signal RWDQSQ and the clock signal CLK due to tDQSS and power noise may be compensated for.

In accordance with the embodiments of the present invention, data may be stably read and written at high speed by using the strobe signal provided by the controller.

While certain embodiments have been described above, it will be understood to those skilled in the art that the embodiments described are by way of example only. Accordingly, the semiconductor memory circuit and the data processing system using the same described herein should not be limited based on the described embodiments. Rather, the semiconductor memory circuit and the data processing system described herein should only be limited in light of the claims that follow when taken in conjunction with the above description and accompanying drawings.

What is claimed is:

1. A semiconductor memory circuit, comprising:
   a command decoder configured to generate a read command by decoding a command signal based on a clock signal;
   a data path activation unit configured to generate a selection signal in response to an address signal and the read command;
   a memory block configured to provide a signal line with data corresponding to the selection signal;
   an output latch unit configured to output the data of the signal line in response to data output enable signals; and
   an output timing adjustment unit configured to generate the data output enable signals which are criteria for an external strobe signal by adjusting a timing of the read command in response to the strobe signal.

2. The semiconductor memory circuit according to claim 1, wherein the memory block is configured to generate an information signal informing that the data is outputted through the signal line.

3. The semiconductor memory circuit according to claim 2, wherein the output latch unit is configured to output the data of the signal line in response to the information signal and the data output enable signals.

4. The semiconductor memory circuit according to claim 1, further comprising a multiplexing unit configured to multiplex output signals of the output latch unit through a pad DQ in response to phase separation strobe signals from which a phase of the strobe signal has been separated.

5. The semiconductor memory circuit according to claim 1, wherein the output timing adjustment unit comprises:
   a timing clock generator configured to shift the read command based on preamble signals and postamble signals in response to the clock signal and generate a plurality of timing clocks based on the shifted read command, and a command register configured to latch the other of the plurality of timing clocks based on one of the plurality of timing clocks and output the latched timing clock as the data output enable signals based on the strobe signal.

6. The semiconductor memory circuit according to claim 5, wherein a number of pulses of any one of the timing clocks is varied depending on a number of preamble pulses and a number of postamble pulses for command.

7. The semiconductor memory circuit according to claim 5, wherein the timing clock generator comprises:
   a counter configured to count the read command in response to the clock signal and generate a preliminary timing clock based on the count,
   a plurality of flip-flops configured to shift the preliminary timing clock and generate a plurality of preliminary timing clock based on the shifted preliminary timing clock,
   a plurality of multiplexers configured to output the plurality of preliminary timing clocks selectively in response to the preamble signals and output one of the plurality of preliminary timing clocks as the other timing clock,
   a first logic gate group configured to provide the clock signal to the plurality of flip-flops in response to the postamble signals and the preamble signals, and
   a second logic gate group configured to perform an OR operation on the plurality of preliminary timing clocks, perform an AND operation on a result of the OR operation and the clock signal, and output a result of the AND operation as the one timing clock.

\* \* \* \* \*